(12) United States Patent
Jeong

(10) Patent No.: US 9,948,298 B2
(45) Date of Patent: Apr. 17, 2018

(54) IMPEDANCE CALIBRATION CIRCUIT AND SEMICONDUCTOR APPARATUS INCLUDING THE SAME

(71) Applicant: SK hynix Inc., Icheon-si Gyeonggi-do (KR)

(72) Inventor: Yo Han Jeong, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/377,225

(22) Filed: Dec. 13, 2016

(65) Prior Publication Data

US 2018/0019751 A1 Jan. 18, 2018

(30) Foreign Application Priority Data

Jul. 13, 2016 (KR) ........................ 10-2016-0088348

(51) Int. Cl.
 H03K 17/16 (2006.01)
 H03K 19/003 (2006.01)
 H03K 19/00 (2006.01)
 H03K 17/687 (2006.01)

(52) U.S. Cl.
 CPC ....... *H03K 19/0005* (2013.01); *H03K 17/687* (2013.01)

(58) Field of Classification Search
 CPC ..................... H03K 19/0005; H03K 17/687

USPC ..................................................... 326/30, 82
 See application file for complete search history.

(56) References Cited

U.S. PATENT DOCUMENTS

| | | | | |
|---|---|---|---|---|
| 7,479,800 B1 * | 1/2009 | Vullaganti | ......... | H03K 19/0005 326/21 |
| 7,888,962 B1 * | 2/2011 | Om | .................. | H03K 19/01742 326/30 |
| 8,036,846 B1 * | 10/2011 | Vullaganti | ......... | H03K 19/0005 324/750.03 |

FOREIGN PATENT DOCUMENTS

KR 1020130093231 A 8/2013

\* cited by examiner

*Primary Examiner* — Daniel D Chang
(74) *Attorney, Agent, or Firm* — William Park & Associates Ltd.

(57) ABSTRACT

An impedance calibration circuit includes a first detection unit configured to generate a first pull-up impedance detection signal according to a resistance value of an internal reference resistor, a second detection unit configured to generate a second pull-up impedance detection signal according to a resistance value of an external reference resistor coupled to an external reference resistor pad, a switching unit configured to select the first pull-up impedance detection signal or the second pull-up impedance detection signal according to the internal impedance calibration enable signal and output the selected pull-up impedance detection signal, and an impedance calibration signal generation unit configured to generate a plurality of impedance calibration signals according to an output of the switching unit.

4 Claims, 5 Drawing Sheets

IMPEDANCE CALIBRATION CIRCUIT AND SEMICONDUCTOR APPARATUS INCLUDING THE SAME

CROSS-REFERENCES TO RELATED APPLICATION

This application claims priority under 35 U.S.C. 119(a) to Korean application No. 10-2016-0088348, filed on Jul. 13, 2016, in the Korean intellectual property Office, which is incorporated by reference in its entirety as set forth in full.

BACKGROUND

1. Technical Field

Various embodiments of the inventive concept relate to a semiconductor integrated circuit, and more particularly, to an impedance calibration circuit and a semiconductor apparatus including the same.

2. Related Art

Semiconductor circuits may include an impedance calibration circuit configured to perform an impedance calibration operation which calibrates impedance of a corresponding component to a target value so as to ensure an accurate operation of an on die termination circuit and a driver.

The impedance calibration circuit may perform the impedance calibration operation based on a resistance value of a reference resistor.

When the semiconductor circuit is applied to a system which supports the impedance calibration operation, the corresponding system may include a reference resistor.

Accordingly, the semiconductor circuit may perform the impedance calibration operation using the reference resistor of the system, that is, an external reference resistor.

When the corresponding system does not support the impedance calibration operation, the corresponding system may not include the reference resistor, and thus it is difficult for the semiconductor circuit to perform the impedance calibration operation due to absence of the external reference resistor.

SUMMARY

One or more exemplary embodiments are provided to an impedance calibration circuit capable of performing an impedance calibration operation regardless of an external reference resistor and a semiconductor apparatus including the same.

According to an embodiment, there is provided an impedance calibration circuit. The impedance calibration circuit may include: a first detection unit configured to generate a first pull-up impedance detection signal according to a resistance value of an internal reference resistor; a second detection unit configured to generate a second pull-up impedance detection signal according to a resistance value of an external reference resistor coupled to an external reference resistor pad; a switching unit configured to select the first pull-up impedance detection signal or the second pull-up impedance detection signal according to an internal impedance calibration enable signal and output the selected pull-up impedance detection signal; and an impedance calibration signal generation unit configured to generate a plurality of impedance calibration signals according to an output of the switching unit.

According to an embodiment, there is provided a semiconductor apparatus. The semiconductor apparatus may include: a driving circuit configured to drive data and output a driving result outside the semiconductor apparatus by driving the data; a control circuit configured to internally generate a dummy impedance calibration command according to a voltage level of a power terminal; and an impedance calibration circuit configured to generate a plurality of impedance calibration signals by performing an impedance calibration operation using an internal reference resistor according to the dummy impedance calibration command and calibrate values of the plurality of impedance calibration signals by performing the impedance calibration operation using an external reference resistor when an external impedance calibration command is input.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
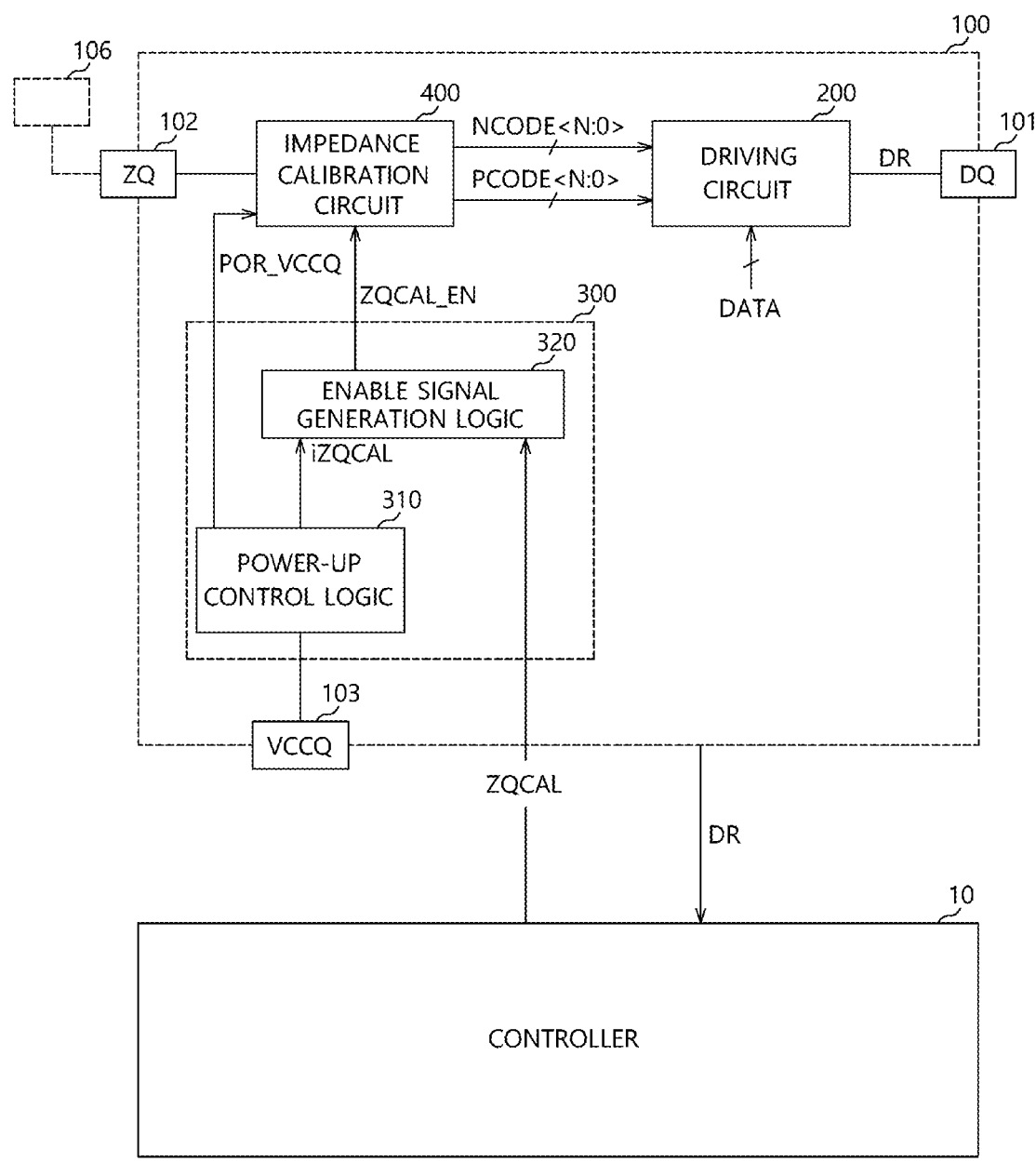
FIG. 1 is a diagram illustrating a configuration of a semiconductor apparatus according to an embodiment of the inventive concept.

Exemplary embodiments will be described in greater detail with reference to the accompanying drawings. Exemplary embodiments are described herein with reference to cross-sectional illustrations that are schematic illustrations of the exemplary embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling to another component but also indirectly coupling to another component through an intermediate component. In addition, a singular form may include a plural form, and vice versa as long as it is not specifically mentioned.

The inventive concept is described herein with reference to cross-section and/or plan illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made to these exemplary embodiments without departing from the principles and spirit of the inventive concept.

As illustrated in FIG. 1, a semiconductor apparatus 100 according to an embodiment may include a driving circuit 200, a control circuit 300, and an impedance calibration circuit 400.

The driving circuit 200 may drive data DATA and output a driving result DR outside the semiconductor apparatus 100, for example, the driving circuit 200 may output the driving result DR to a controller 10 through a data input/output (I/O) pad (DQ) 101.

A termination resistance value of the driving circuit 200 may be set to a target value according to an impedance calibration signal, for example, a first impedance calibration signal PCODE<N:0> and a second impedance calibration signal NCODE<N:0>.

The control circuit 300 may be coupled to a power terminal (VCCQ) 103.

The control circuit 300 may perform a power-up sequence and internally generate a dummy impedance calibration command according to a voltage level of the power terminal 103, where the dummy impedance calibration command may be internally generated after power-up. The dummy impedance calibration command may also be known as an internal impedance calibration command iZQCAL.

The control circuit 300 may generate a power-up signal POR_VCCQ according to the voltage level of the power terminal 103.

The control circuit 300 may generate the pulse-type power-up signal POR_VCCQ when the voltage level of the power terminal 103 is greater or equal to a target level.

The control circuit 300 may generate an impedance calibration enable signal ZQCAL_EN according to the internal impedance calibration command iZQCAL and an external impedance calibration command ZQCAL provided from outside the semiconductor apparatus 100, for example, the controller 10.

The control circuit 300 may include a power-up control logic 310 and an enable signal generation logic 320.

The power-up control logic 310 may generate the power-up signal POR_VCCQ according to the voltage level of the power terminal 103 and generate the dummy impedance calibration command, that is, the internal impedance calibration command iZQCAL according to the power-up.

The enable signal generation logic 320 may generate the impedance calibration enable signal ZQCAL_EN according to the internal impedance calibration command iZQCAL, and the external impedance calibration command ZQCAL may be provided from outside the semiconductor apparatus 100, for example, the controller 10.

The impedance calibration circuit 400 may be coupled to an external reference resistor pad (ZQ) 102.

The impedance calibration circuit 400 may generate the first impedance calibration signal PCODE<N:0> and the second impedance calibration signal NCODE<N:0> by performing the impedance calibration operation based on a resistance value of an internal reference resistor (see 411 of FIG. 2) according to an initial impedance calibration command after power-up, that is, the internal impedance calibration command iZQCAL. Further, the impedance calibration circuit 400 may calibrate values of the first impedance calibration signal PCODE<N:0> and the second impedance calibration signal NCODE<N:0> by performing the impedance calibration operation based on a resistance value of an external reference resistor 106 according to an impedance calibration command, that is, the external impedance calibration command ZQCAL which may be received after the internal impedance calibration command iZQCAL.

When the controller 10 coupled to the semiconductor apparatus 100 supports the impedance calibration operation, the controller 10 may provide the external impedance calibration command ZQCAL to the semiconductor apparatus 100, and the external reference resistor 106 may be coupled to the external reference resistor pad 102.

When the controller 10 coupled to the semiconductor apparatus 100 does not support the impedance calibration operation, the controller 10 may possibly not provide a separate impedance calibration command, that is, the external impedance calibration command ZQCAL to the semiconductor apparatus 100, and the external reference resistor 106 may possibly not be coupled to the external reference resistor pad 102.

Figure 2:
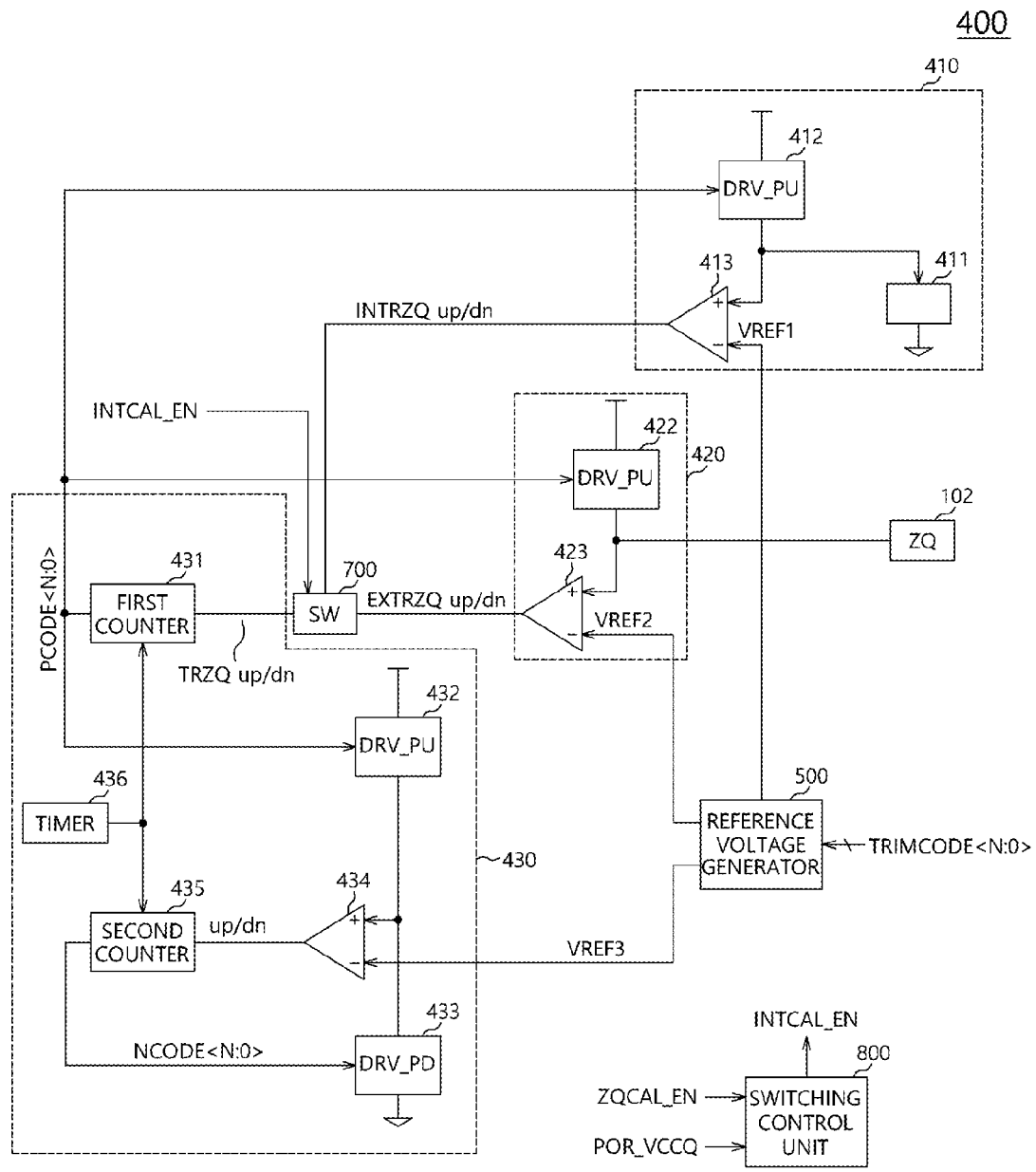
FIG. 2 is a diagram illustrating a configuration of an impedance calibration circuit illustrated in FIG. 1.

As illustrated in FIG. 2, the impedance calibration circuit 400 may include a first detection unit 410, a second detection unit 420, an impedance calibration signal generation unit 430, a reference voltage generator 500, a switching unit 700, and a switching control unit 800.

The reference voltage generator 500 may generate a first reference voltage to a third reference voltage VREF1 to VREF3.

The reference voltage generator 500 may generate the first to third reference voltages VREF1 to VREF3 to have the same level, for example, a level corresponding to half the voltage level of the power terminal VCCQ.

If necessary, the reference voltage generator 500 may generate the first to third reference voltages VREF1 to VREF3 having voltage levels different from each other, and the reference voltage generator 500 may independently adjust the levels of the first to the third reference voltages VREF1 to VREF3 according to a trimming code TRIMCODE<N:0>.

The switching control unit 800 may generate the internal impedance calibration enable signal INTCAL_EN according to at least one of the power-up signal POR_VCCQ and the impedance calibration enable signal ZQCAL_EN.

The first detection unit 410 may generate a first pull-up impedance detection signal INTRZQ up/dn according to a resistance value of an internal reference resistor 411.

The first detection unit 410 may include the internal reference resistor 411, a replica pull-up driver (DRV_PU) 412, and a comparator 413.

The replica pull-up driver 412 may be coupled between a power terminal and the internal reference resistor 411. Further, the replica pull-up driver 412 and the internal reference resistor 411 may be coupled between the power terminal and a ground terminal.

The internal reference resistor 411 may be configured to be inside the semiconductor apparatus 100, and may be designed to have a specific resistance value, for example, 300 ohms.

The replica pull-up driver 412 may be configured by replicating a pull-up driver included in the driving circuit 200 of FIG. 1.

A termination resistance value of the replica pull-up driver 412 may be set to a target value, for example, 300 ohms according to the first impedance calibration signal PCODE<N:0>.

The comparator 413 may generate the first pull-up impedance detection signal INTRZQ up/dn by comparing a level of a node to which the replica pull-up driver 412 and the internal reference resistor 411 are coupled with a level of the first reference voltage VREF1.

The second detection unit 420 may generate a second pull-up impedance detection signal EXTRZQ up/dn according to a resistance value of the external reference resistor 106 coupled to the external reference resistor pad 102.

The second detection unit 420 may include a replica pull-up driver 422 and a comparator 423.

The replica pull-up driver 422 may be coupled between the power terminal and the external reference resistor pad 102.

The external reference resistor 106 may be coupled to the external reference resistor pad 102.

The external reference resistor 106 may be configured outside the semiconductor apparatus 100, and may be designed to have a specific resistance value, for example, 300 ohms.

The replica pull-up driver 422 may have the same configuration as that of the replica pull-up driver 412.

The comparator 423 may generate the second pull-up impedance detection signal EXTRZQ up/dn by comparing a level of a node to which the replica pull-up driver 422 and the external reference resistor pad 102 are coupled with a level of the second reference voltage VREF2.

The switching unit 700 may select one of the first pull-up impedance detection signal INTRZQ up/dn and the second pull-up impedance detection signal EXTRZQ up/dn according to the internal impedance calibration enable signal INTCAL_EN, and the switching unit 700 may output the selected pull-up impedance detection signal TRZQ up/dn.

The impedance calibration signal generation unit 430 may generate the first impedance calibration signal PCODE<N:0> and the second impedance calibration signal NCODE<N:0> according to an output of the switching unit 700.

The impedance calibration signal generation unit 430 may include a first counter 431, a replica pull-up driver 432, a replica pull-down driver 433, a comparator 434, a second counter 435, and a timer 436.

The timer 436 may activate the first counter 431 and the second counter 435 for a preset time.

The first counter 431 may increase or decrease a value of the first impedance calibration signal PCODE<N:0> according to the output of the switching unit 700 during a period activated through the timer 436.

When the first counter 431 is inactivated, the first counter 431 may maintain a final value of the first impedance calibration signal PCODE<N:0> in the activation period.

The replica pull-up driver 432 may have substantially the same configuration as that of the replica pull-up driver 412.

The replica pull-down driver (DRV_PD) 433 may be configured by replicating a pull-down driver included in the driving circuit 200 of FIG. 1.

A termination resistance value of the replica pull-down driver 433 may be set to a target value, for example, 300 ohms according to the second impedance calibration signal NCODE<N:0>.

The comparator 434 may generate a pull-down impedance detection signal up/dn by comparing a level of a node to which the replica pull-up driver 432 and the replica pull-down driver 433 are coupled with a level of the third reference voltage VREF3.

The second counter 435 may increase or decrease a value of the second impedance calibration signal NCODE<N:0> according to the pull-down impedance detection signal up/dn during a period activated through the timer 436.

When the second counter 435 is inactivated, the second counter 435 may maintain a final value of the second impedance calibration signal NCODE<N:0> in the activation period.

Figure 3:
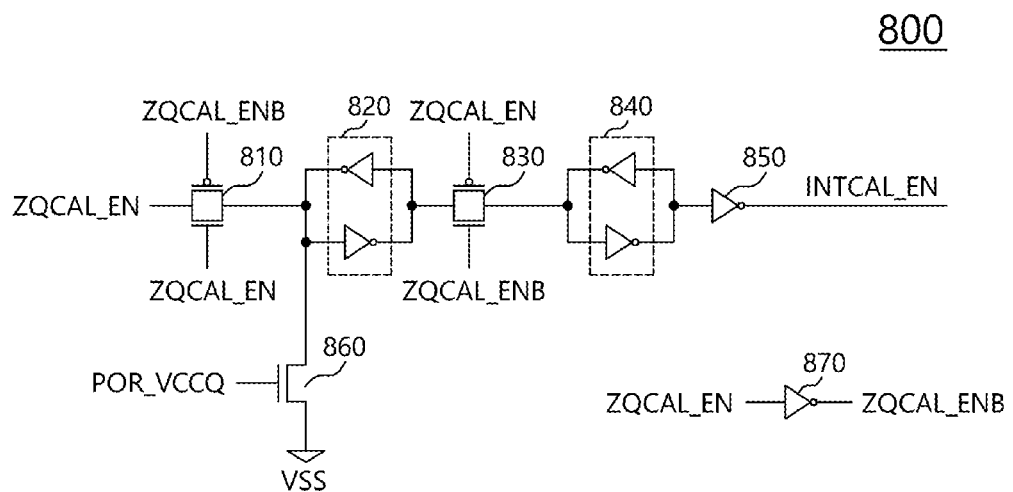
FIG. 3 is a diagram illustrating a configuration of a switching control unit illustrated in FIG. 2.
Figure 4:
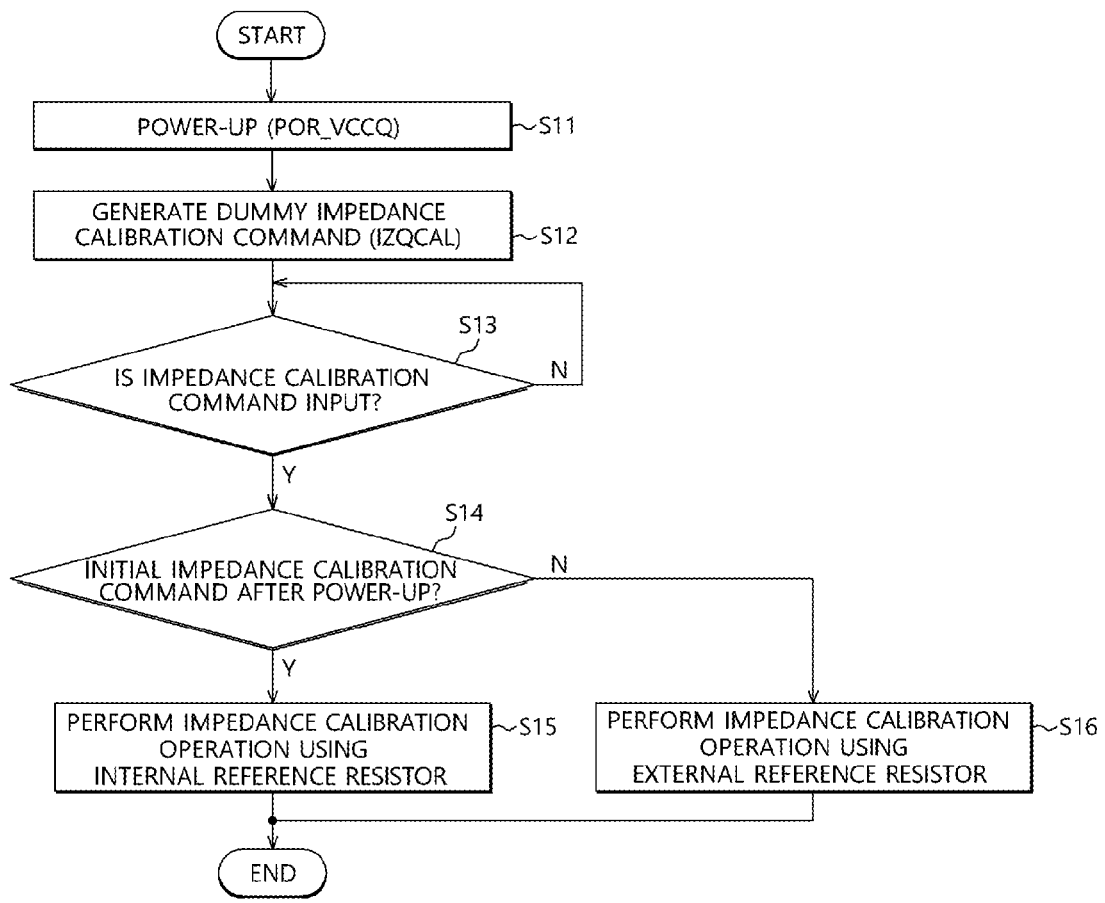
FIG. 4 is a flowchart illustrating an impedance calibration operation according to an embodiment of the inventive concept.

As illustrated in FIG. 3, the switching control unit 800 may include a first transmission gate 810, a first latch 820, a second transmission gate 830, a second latch 840, a first inverter 850, a transistor 860, and a second inverter 870.

The second inverter 870 may generate a negative impedance calibration enable signal ZQCAL_ENB by inverting the impedance calibration enable signal ZQCAL_EN.

The first transmission gate 810 may transmit the impedance calibration enable signal ZQCAL_EN when the impedance calibration enable signal ZQCAL_EN is transited to a high level.

The first latch 820 may latch a level of an output signal of the first transmission gate 810.

The transistor 860 may be coupled to an input terminal of the first latch 820 and may initialize the internal impedance calibration enable signal INTCAL_EN to a high level in response to the power-up signal POR_VCCQ.

The second transmission gate 830 may transfer the signal having the level latched in the first latch 820 when the impedance calibration enable signal ZQCAL_EN is transited to a low level.

The second latch 840 may latch a level of an output signal of the second transmission gate 830.

The first inverter 850 may output the internal impedance calibration enable signal INTCAL_EN by inverting an output of the second latch 840.

An operation of the switching control unit 800 will be described below.

As the pulse-type power-up signal POR_VCCQ is generated, a signal of a ground level VSS may be output when the internal impedance calibration enable signal INTCAL_EN of a high level is output through the first latch 820, the second transmission gate 830, the second latch 840, and the first inverter 850.

The initial impedance calibration command after power-up, that is, the impedance calibration enable signal ZQCAL_EN after the power-up signal POR_VCCQ is generated and a preset time has elapsed may be maintained to a high level for a preset time and then transited to a low level.

While the impedance calibration enable signal ZQCAL_EN is maintained at a high level, the negative impedance calibration enable signal ZQCAL_ENB is a low level. Accordingly, the signal of the low level stored in the first latch 820 may not be transmitted to the second latch 840 and the internal impedance calibration enable signal INTCAL_ENB may be maintained at the high level.

When the impedance calibration enable signal ZQCAL_EN is transited to a low level, the negative impedance calibration enable signal ZQCAL_ENB is a high level. Accordingly, the low level signal stored in the first latch 820 may be transmitted to the second latch 840, and the internal impedance calibration enable signal INTCAL_EN may be transited to the low level.

Hereinafter, an impedance calibration operation according to an embodiment will be described with reference to FIGS. 1 to 4.

As a level of power supplied to the semiconductor apparatus 100 through the power terminal VCCQ is increased to a target level or more, power-up may proceed and the power-up signal POR_VCCQ may be generated (S11).

The semiconductor apparatus 100 may generate the dummy impedance calibration command iZQCAL after power-up (S12).

The semiconductor apparatus 100 may determine whether the impedance calibration command is input to the semiconductor apparatus 100 (S13).

As a determination result in operation S13, when the impedance calibration command is input, the semiconductor apparatus 100 may determine whether the input command is the initial impedance calibration command after power-up (S14).

The impedance calibration enable signal ZQCAL_EN may be generated according to the dummy impedance calibration command iZQCAL.

Accordingly, the semiconductor apparatus 100 may determine whether the impedance calibration command is input according to the impedance calibration enable signal ZQCAL_EN.

As a determination result in operation S14, when the input impedance calibration command is the initial impedance calibration command after power-up, the semiconductor apparatus 100 may perform the impedance calibration operation using the internal reference resistor 411 of FIG. 2 (S15).

As described above with reference to FIG. 3, while the initial impedance calibration enable signal ZQCAL_EN after power-up is maintained to the high level, the internal impedance calibration enable signal INTCAL_EN may be the high level.

Since the internal impedance calibration enable signal INTCAL_EN is the high level, the switching unit 700 of FIG. 2 may select the first pull-up impedance detection signal INTRZQ up/dn and provide the selected first pull-up impedance detection signal INTRZQ up/dn to the first counter 431 and thus the impedance calibration operation using the internal reference resistor 411 of FIG. 2 may be performed.

As the determination result in operation S14, when the input impedance calibration command is not the initial impedance calibration command after power-up, that is, when the input impedance calibration command is the external impedance calibration command ZQCAL which is input after the dummy impedance calibration command iZQCAL, the semiconductor apparatus may perform the impedance calibration operation using the external reference resistor 106 coupled to the external reference resistor pad 102 of FIG. 2 (S16).

As described above with reference to FIG. 3, after the initial impedance calibration enable signal ZQCAL_EN after power-up is transited to the low level, the internal impedance calibration enable signal INTCAL_EN is transited to the low level.

Since the internal impedance calibration enable signal INTCAL_EN is the low level, the switching unit 700 of FIG. 2 may select the second pull-up impedance detection signal EXTRZQ up/dn and provide the selected second pull-up impedance detection signal EXTRZQ up/dn to the first counter 431 and thus the impedance calibration operation using the external reference resistor 106 coupled to the external reference resistor pad 102 may be performed.

When the controller 10 of FIG. 1 supports the impedance calibration operation, the external impedance calibration command ZQCAL may be provided to the semiconductor apparatus 100. When the controller 10 of FIG. 1 does not support the impedance calibration operation, the external impedance calibration command ZQCAL may not be provided to the semiconductor apparatus 100.

The above embodiment of the present disclosure is illustrative and not limitative. Various alternatives and equivalents are possible. The disclosure not limited by the embodiments described herein. Nor are the disclosed embodiments limited to any specific type of semiconductor device. Other additions, subtractions, or modifications are obvious in view of the present disclosure and are intended to fall within the scope of the appended claims.

Figure 5:
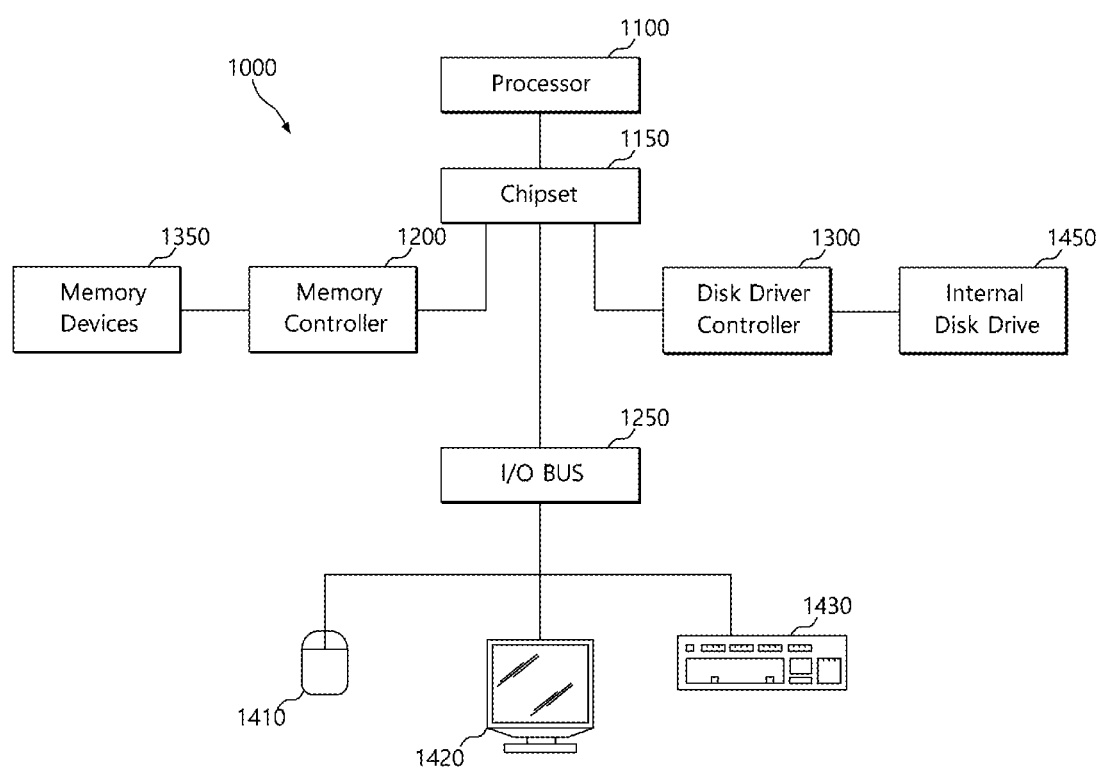
FIG. 5 illustrates a block diagram of an example system employing a semiconductor device in accordance with the various embodiments discussed above with relation to FIGS. 1-4.

The semiconductor apparatus (see FIGS. 1-4) is particularly useful in the design of memory devices, processors, and computer systems. For example, referring to FIG. 5, a block diagram of a system employing a semiconductor apparatus 100 in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus 100 as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus 100 discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor apparatus 100 as discussed above with relation to FIGS. 1-4. In alternate embodiments, such as, for example but not limited to, cellular phones or digital cameras, the components may differ from the embodiments illustrated in FIG. 5.

What is claimed is:

1. An impedance calibration circuit comprising:
    a first detection unit configured to generate a first pull-up impedance detection signal according to a resistance value of an internal reference resistor;
    a second detection unit configured to generate a second pull-up impedance detection signal according to a resistance value of an external reference resistor coupled to an external reference resistor pad;
    a switching unit configured to select the first pull-up impedance detection signal or the second pull-up impedance detection signal according to an internal impedance calibration enable signal and output the selected pull-up impedance detection signal; and
    an impedance calibration signal generation unit configured to generate a plurality of impedance calibration signals according to an output of the switching unit,
    wherein the first detection unit includes:
        a replica pull-up driver coupled between a power terminal and the internal reference resistor; and
        a comparator configured to generate the first pull-up impedance detection signal by comparing a level of a node to which the replica pull-up driver and the internal reference resistor are coupled with a level of a reference voltage.

2. The impedance calibration circuit of claim 1, wherein the second detection unit includes:
    a replica pull-up driver coupled between a power terminal and the external reference resistor pad; and
    a comparator configured to generate the second pull-up impedance detection signal by comparing a level of a node to which the replica pull-up driver and the external reference resistor pad are coupled with a level of a reference voltage.

3. The impedance calibration circuit of claim 1, wherein the impedance calibration signal generation unit includes a first counter configured to increase or decrease a value of a first impedance calibration signal among the plurality of impedance calibration signals according to the output of the switching unit.

4. The impedance calibration circuit of claim 3, wherein the impedance calibration signal generation unit further includes:
    a replica pull-up driver;
    a comparator configured to generate a pull-down impedance detection signal by comparing a level of a node to which the replica pull-up driver and a replica pull-down driver are coupled with a level of a reference voltage; and
    a second counter configured to increase or decrease a value of a second impedance calibration signal among the plurality of impedance calibration signals according to the pull-down impedance detection signal.

* * * * *